(12) United States Patent
Ouderkirk et al.

(10) Patent No.: US 9,151,463 B2
(45) Date of Patent: Oct. 6, 2015

(54) LED COLOR COMBINER

(75) Inventors: Andrew J. Ouderkirk, St. Paul, MN (US); Xiaohui Cheng, Singapore (SG); Ravi Palaniswamy, Singapore (SG); Arokiaraj Jesudoss, Singapore (SG); Yarn Chee Poon, Singapore (SG); Zhisheng Yun, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 37 days.

(21) Appl. No.: 13/992,100

(22) PCT Filed: Dec. 19, 2011

(86) PCT No.: PCT/US2011/065778
§ 371 (c)(1),
(2), (4) Date: Jun. 6, 2013

(87) PCT Pub. No.: WO2012/091972
PCT Pub. Date: Jul. 5, 2012

(65) Prior Publication Data
US 2013/0250570 A1    Sep. 26, 2013

Related U.S. Application Data

(60) Provisional application No. 61/428,038, filed on Dec. 29, 2010.

(51) Int. Cl.
| F21V 7/00 | (2006.01) |
| G02B 27/10 | (2006.01) |
| H01L 25/075 | (2006.01) |

(52) U.S. Cl.
CPC .............. *F21V 7/00* (2013.01); *G02B 27/1006* (2013.01); *H01L 25/0753* (2013.01); *H01L 2924/0002* (2013.01)

(58) Field of Classification Search
CPC .......................................................... F21V 7/00
See application file for complete search history.

(56) References Cited

U.S. PATENT DOCUMENTS

| 5,882,774 A | 3/1999 | Jonza |
| 6,091,195 A | 7/2000 | Forrest |

(Continued)

FOREIGN PATENT DOCUMENTS

| CN | 1595671 | 3/2005 |
| TW | 200617421 | 6/2006 |

(Continued)

OTHER PUBLICATIONS

Cobb, "An LED multiplexer with improved efficiency", Proc. of SPIE, 2008, vol. 7103, pp. 710308-1-710308-5.

(Continued)

*Primary Examiner* — Elmito Breval
(74) *Attorney, Agent, or Firm* — Gregg H. Rosenblatt

(57) ABSTRACT

A light source combines colored light from different LED sources to provide white light output. Multiple LEDs emitting light at different peak wavelengths may be disposed on a flexible substrate, the LEDs being close to an aperture formed in the substrate. Multiple mirrors, including at least one dichroic mirror, are oriented to reflect light from the multiple LEDs into the aperture. The flexible substrate includes a dielectric layer having a cavity region and an adjacent neighboring region that is thicker than the cavity region. The aperture and the multiple LEDs are all disposed in the cavity region of the dielectric layer. An integrating rod may be coupled to the aperture to receive the reflected light from the multiple LEDs.

20 Claims, 8 Drawing Sheets

(56) References Cited

U.S. PATENT DOCUMENTS

| | | |
|---|---|---|
| 6,292,300 B1 | 9/2001 | Lee et al. |
| 6,783,349 B2 | 8/2004 | Neavin |
| 6,967,778 B1 | 11/2005 | Wheatley |
| 7,144,121 B2 | 12/2006 | Minano |
| 7,145,719 B2 | 12/2006 | Williams |
| 7,199,400 B2 | 4/2007 | Sasuga |
| 7,330,314 B1 | 2/2008 | Cobb |
| 7,445,340 B2 | 11/2008 | Conner |
| 7,540,616 B2 | 6/2009 | Conner |
| 7,572,031 B2 | 8/2009 | Schultz |
| 7,648,244 B2 | 1/2010 | Lee |
| 7,710,045 B2 | 5/2010 | Schultz |
| 7,744,241 B2 | 6/2010 | Xu |
| 7,798,678 B2 | 9/2010 | Destain |
| 7,806,560 B2 | 10/2010 | Schultz |
| 2005/0116235 A1 | 6/2005 | Schultz |
| 2005/0117125 A1 | 6/2005 | Minano |
| 2005/0265029 A1 | 12/2005 | Epstein |
| 2006/0039140 A1 | 2/2006 | Magarill |
| 2006/0098438 A1 | 5/2006 | Ouderkirk |
| 2007/0120089 A1 | 5/2007 | Mao |
| 2008/0192464 A1 | 8/2008 | Cheng |
| 2009/0109668 A1 | 4/2009 | Isobe |
| 2010/0220261 A1 | 9/2010 | Mizushima |

FOREIGN PATENT DOCUMENTS

| | | |
|---|---|---|
| TW | 200717868 | 5/2007 |
| WO | WO 98/28947 | 7/1998 |
| WO | WO 2008/106067 | 9/2008 |
| WO | WO 2009-105198 | 8/2009 |
| WO | WO 2009-150580 | 12/2009 |
| WO | WO 2012-061010 | 5/2012 |
| WO | WO 2012-061183 | 5/2012 |
| WO | WO 2012-061184 | 5/2012 |
| WO | WO 2012-091971 | 7/2012 |
| WO | WO 2012-091973 | 7/2012 |
| WO | WO 2012-091975 | 7/2012 |
| WO | WO 2013-062932 | 5/2013 |
| WO | WO 2013-095482 | 6/2013 |

OTHER PUBLICATIONS

International Search Report for PCT International Application No. PCT/US2011/065778 Mailed, Mar. 27, 2012, 3 pages.

Office Action in corresponding Chinese patent application No. 201180063689.7 dated Nov. 27, 2014 (7pgs).

TW Application No. 100149349 Search Report dated May 7, 2015, 1pg.

Chinese Search Report for Chinse Application No. 2011800636897, dated Jun. 25, 2015, 2pgs.

LED COLOR COMBINER

TECHNICAL FIELD

This invention relates generally to light sources, with particular application to such light sources that utilize dichroic reflectors or the like to combine light from different colored LEDs or other light emitting devices to produce broadband output light such as white light. The invention also relates to associated articles, systems, and methods.

BACKGROUND

Color combiners, in which light from a plurality of colored LEDs or other sources is combined using a set of suitably designed dichroic mirrors, so as to produce substantially white output light, are known. Reference is made, for example, to U.S. Pat. No. 7,330,314.

SUMMARY

We have developed a new family of LED color combiners, or broadband light sources, that utilize a flexible circuit substrate that is molded, etched, or otherwise shaped to provide a thin cavity region and a thicker neighboring region. An aperture is provided in the cavity region, and LEDs that emit light at different colors or wavelength ranges are mounted on the substrate in the cavity region near the aperture. A plurality of mirrors, including at least one dichroic mirror, is provided to efficiently reflect the light from the individual LEDs into the aperture. Light that enters the aperture provides the broadband output light of the light source. The substrate design can advantageously include electrical circuit traces for delivering power to the LEDs. The substrate design, with its thinned cavity region, can also provide more effective removal of heat that is generated by the LEDs, as well as allow for the convenient creation of the aperture whose size, shape, and placement on the substrate relative to the LEDs can be optimized for maximum device efficiency, for example.

At least some of the disclosed light sources, therefore, combine colored light from different LED sources to provide white light output. Multiple LEDs emit light at different peak wavelengths, and are disposed on a flexible substrate close to an aperture formed in the substrate. Multiple mirrors, including one or more dichroic mirrors, are oriented to reflect light from the multiple LEDs into the aperture. The flexible substrate includes a dielectric layer having a cavity region and an adjacent neighboring region that is thicker than the cavity region. The aperture and the multiple LEDs are all disposed in the cavity region of the dielectric layer. An integrating rod may be coupled to the aperture to receive the reflected light from the multiple LEDs.

The present application furthermore discloses, inter alia, light sources that include a flexible substrate, at least a first and second LED disposed on the substrate, and a set or plurality of mirrors including at least one dichroic mirror. The first and second LEDs are adapted to emit light at different first and second peak wavelengths respectively. The mirrors are oriented to reflect the light from the first and second LEDs into an aperture in the substrate. The flexible substrate includes a dielectric layer having a cavity region and an adjacent neighboring region that is thicker than the cavity region, and the aperture, the first LED, and the second LED are all disposed in the cavity region.

In some cases, the light source also includes a third LED disposed on the substrate, the third LED being adapted to emit light at a third peak wavelength different from the first and second peak wavelengths, and the plurality of mirrors also being oriented to reflect the light from the third LED into the aperture. In some cases, the light from the first, second, and third LEDs that is reflected into the aperture combines to form a white light output of the light source. In some cases, the light source also includes collimation optics configured to collimate light from the first, second, and third LEDs, the plurality of mirrors then being oriented to reflect the collimated light from the first, second, and third LEDs back to the collimation optics, and the plurality of mirrors in combination with the collimation optics operable to direct light from the first, second, and third LEDs through the aperture.

In some cases, the mirrors are flat, while in other cases, the mirrors are curved. In some cases, the first, second, and third LEDs emit red, green, and blue light respectively. In some cases, the plurality of mirrors includes a first dichroic mirror adapted to reflect light at the first peak wavelength and transmit light at the second peak wavelength. In some cases, the plurality of mirrors includes a first dichroic mirror adapted to reflect light at the first peak wavelength and transmit light at the second and third peak wavelengths. In some cases, the plurality of mirrors includes a second dichroic mirror adapted to reflect light at the second peak wavelength and transmit light at the third peak wavelength. In some cases, the plurality of mirrors includes three different dichroic mirrors.

In some cases, the aperture has a square or rectangular shape in plan view. In some cases, the first LED, the second LED, and the aperture have shapes in plan view that are substantially the same. In some cases, the first LED, the second LED, the third LED, and the aperture each have a square or rectangular shape in plan view.

In some cases, the dielectric layer extends from the cavity region to the neighboring region. In some cases, the dielectric layer has a thickness of no more than 10 microns in the cavity region and a thickness of at least 20 microns in the neighboring region. In some cases, the substrate includes an electrically conductive material disposed on the dielectric layer. In some cases, the electrically conductive material is disposed on a first side of the dielectric layer, and the substrate also includes a thermally conductive layer disposed on a second side of the dielectric layer opposite the first side.

In some cases, the light source also includes an integrating rod coupled to the aperture to receive the reflected light from the first and second LEDs. In some cases, the integrating rod has a square or rectangular shape in cross section. In some cases, the integrating rod has a shape in cross section that matches a plan view shape of the aperture. In some cases, the plan view shape of the aperture is square or rectangular. In some cases, the integrating rod has an optical axis that is tilted relative to an optical axis of the light source, or that is tilted relative to an axis that is perpendicular to the substrate.

In some cases, the first and second LEDs have first and second LED widths respectively, and a center-to-center distance from the aperture to the first LED is no more than 3 times the first LED width, and a center-to-center distance from the aperture to the second LED is no more than 3 times the second LED width. In some cases, the center-to-center distance from the aperture to the first LED is no more than 2 times the first LED width, and the center-to-center distance from the aperture to the second LED is no more than 2 times the second LED width.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION

As mentioned above, the present application describes certain broadband light sources that utilize different colored LEDs mounted on a specialized flexible substrate that also includes an aperture formed therein. A set of mirrors, which includes at least one dichroic mirror, is arranged or configured to reflect light from the various LEDs into the aperture formed in the substrate. By directing light from the different colored LEDs into the same aperture in the substrate, light from those LEDs is mixed together to provide white light or other desirable broadband output light.

In this regard, "light emitting diode" or "LED" refers to a diode that emits light, whether visible, ultraviolet, or infrared. It includes incoherent encased or encapsulated semiconductor devices marketed as "LEDs", whether of the conventional or super radiant variety. If the LED emits non-visible light such as ultraviolet light, and in some cases where it emits visible light, it can be packaged to include a phosphor to convert short wavelength light to longer wavelength visible light, in some cases yielding a device that emits white light.

An "LED die" is an LED in its most basic form, i.e., in the form of an individual component or chip made by semiconductor processing procedures. For example, the LED die may be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can also be used, as well as inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. An "LED" for purposes of this application should also be considered to include organic light emitting diodes, commonly referred to as OLEDs.

The flexible substrates that form a part of the disclosed broadband light sources desirably include a dielectric layer that has at least a thin cavity region and a thicker neighboring region. In some cases, a hole may extend completely through the dielectric layer in the cavity region such that the dielectric layer is absent from that region. Before describing such exemplary flexible substrates in detail, we first describe other aspects of the broad band light sources.

Figure 1:
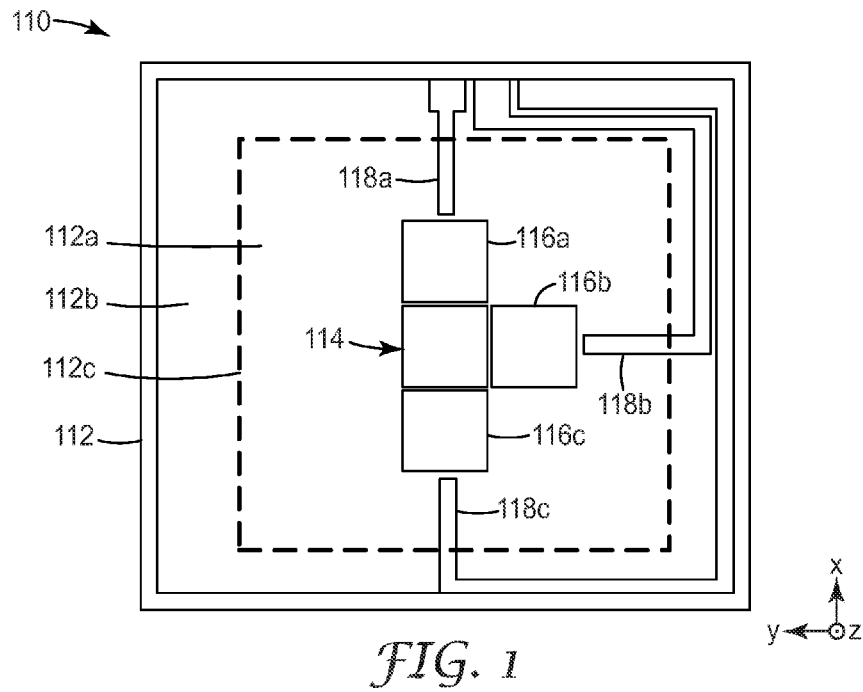
FIG. 1 is a schematic plan view of a portion of a broadband light source.

In FIG. 1, we see a schematic plan view of a component 110 which can form a key portion of a broadband light source. The component is depicted in the context of a Cartesian x-y-z coordinate system for ease of description. The component 110 includes a flexible substrate 112 on which is mounted three distinct LEDs 116a, 116b, 116c. The substrate 112 desirably extends generally parallel to the x-y plane, and is preferably relatively thin along the orthogonal direction (z-axis) for flexibility, greater heat conduction (and lower thermal resistance) to an underlying heat sink (not shown), and for space savings. Although generally thin, the substrate 112 is molded, etched, or otherwise shaped to be even thinner in a cavity region 112a compared to an adjacent or neighboring region 112b, these regions optionally being separated by a transition region 112c. The reduced thickness associated with the cavity region 112a is desirably associated with the reduced thickness of a dielectric layer which forms part of the substrate. The dielectric layer and other design details of exemplary substrates are described in more detail elsewhere herein.

An aperture 114 is also formed in the substrate 112. The aperture may be created during the formation process of the substrate, e.g. as the substrate or component(s) thereof are being molded, or it may be made by etching or otherwise perforating an initially intact or continuous substrate or component thereof. For a sufficiently thin and flexible substrate, a precision aperture of arbitrary shape (e.g. a square or rectangle as shown in FIG. 1) may be quickly and easily formed by a punching or stamping process, e.g., in which a tool having a suitably sharp edge of the desired outer shape or perimeter is forcibly struck against the intact precursor substrate so as to produce the aperture in the substrate. Such a process can be used to quickly, accurately, and economically produce non-circular apertures in the substrate, as well as circular apertures if desired. Alternative processes for forming precision apertures of arbitrary shape include milling, etching, and ablative processes.

The LEDs 116a-c are desirably arranged to be as close as possible to the aperture, and thus close to each other as well. One may consider, for example, the center-to-center distance from the aperture to any given LED. The center-to-center distance may be tailored to be no more than 3 times a width of the LED, or no more than 2 times the width of the LED, where the LED width may be measured along an axis that connects the center of the aperture with the center of the LED. In FIG. 1, such axis corresponds to the x-axis for LEDs 116a and 116c, and the y-axis for LED 116b. Keeping the distance from the aperture to the LEDs small helps to: decrease the required size of lenses, mirrors, and/or other optical elements that are also included as part of the broadband light source; reduce the etendue or increase the brightness of the light source; or combinations thereof.

In an exemplary embodiment one of the LEDs may emit red light, another may emit green light, and another may emit blue light, for a 3-LED "RGB" combination, although other combinations are also contemplated. Such other combinations include combinations with color combinations other than RGB, combinations involving only two LEDs, combinations involving more than three LEDs, and combinations in which two or more LEDs emit nominally the same color of light, such as a 4-LED combination of RGGB. Red light emitting LEDs generally have a greater drop in output with increased operating temperature than blue or green LEDs, and red LEDs tend to generate significant amounts of heat. For this reason, it may be desirable to position a red LED on the substrate in such a way as to allocate a significant portion of the area of the substrate to dissipate heat from the red LED. Furthermore, since green LEDs also tend to generate significant amounts of heat, if both a red and green LED are included in the LED set, it may be desirable to separate the red LED from the green LED to the extent possible. For example, element 116a of FIG. 1 may be a red LED, element 116b may be a blue LED, and element 116c may be a green LED.

The shape of the aperture in plan view is also a significant design consideration of the broadband light source. In exemplary embodiments, the aperture shape is made to be the same (i.e., substantially the same, e.g. within standard manufacturing tolerances) or at least similar to each of the LEDs, wherein the LEDs desirably all have the same (i.e., substantially the same, e.g. within standard manufacturing tolerances) or similar shapes in plan view relative to each other as well. This is because in many embodiments, lenses, mirrors, and/or other optical elements of the light source cooperate to form a substantial image of each LED onto the aperture. Most commercially available LED dies are, at present, square or rectangular. As a result, it is desirable for the aperture in the substrate to also have a square or rectangular shape. Such shapes are difficult to machine in a rapid and economical way in most conventional electrical substrates, such as in conventional metal core circuit boards (MCB) or conventional ceramic circuit boards. In many cases it is desirable to mount an integrating rod, discussed further below, in the aperture so as to collect and mix light from the different LEDs, and in such cases it is also desirable for the integrating rod to substantially fill the aperture and thus have substantially the same shape in plan view as the aperture.

The substrate may be configured with one or more patterned or unpatterned electrically conductive layers that can be used to supply power to one or more of the LEDs. In FIG. 1, the substrate 112 is provided with electrically conductive patterned traces 118a, 118b, 118c, which may comprise a metal such as copper or other suitable materials. The traces 118a, 118b, 118c may be electrically connected to the respective LEDs 116a, 116b, 116c with wire bonds or by other suitable structures. The other ends of the traces may be connected to suitable power supplies so as to energize the LEDs by appropriate amounts to provide the desired total output power and color balance of the broadband light source.

Figure 2:
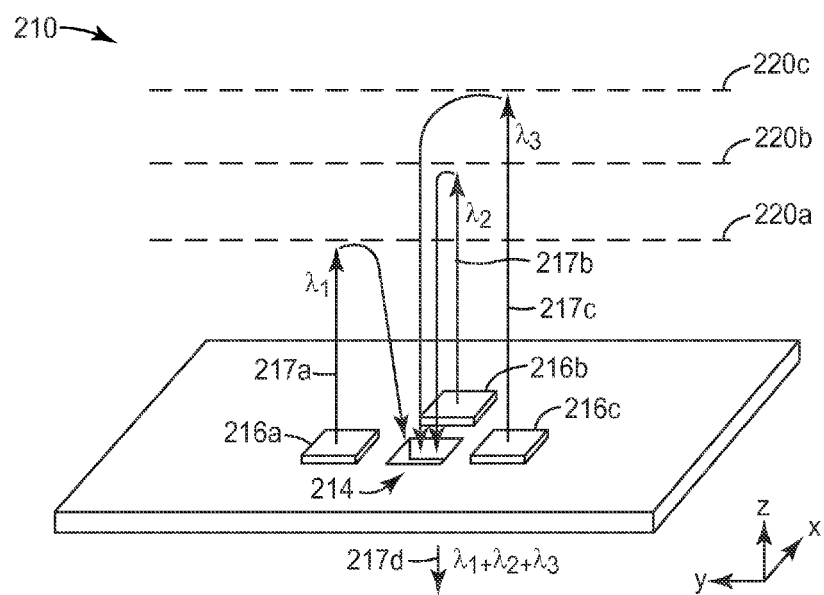
FIG. 2 is a schematic perspective view of a broadband light source.

FIG. 2 is a schematic perspective view of a broadband light source 210 which may utilize a component such as that of FIG. 1 or other such components described herein. In the source 210, a substrate 212 carries a plurality of LEDs 216a, 216b, 216c that are adapted to emit light at different colors as previously described, e.g., light distributions having different peak wavelengths $\lambda 1, \lambda 2, \lambda 3$ respectively. The drawing shows in schematic fashion that LED 216a emits light 217a having peak wavelength $\lambda 1$, LED 216b emits light 217b having peak wavelength $\lambda 2$, and LED 216c emits light 217c having peak wavelength $\lambda 3$. The LEDs may be mounted on the substrate near an aperture 214 that is formed in the substrate. In exemplary embodiments, the LEDs and the aperture have the same or similar shape in plan view.

The light source 210 includes a plurality of mirrors 220a, 220b, 220c which are configured to reflect light from each of the LEDs into the aperture in an efficient manner. Mirror 220a substantially reflects light of wavelength $\lambda 1$ but substantially transmits light of wavelength $\lambda 2$ and $\lambda 3$, and this mirror is oriented to reflect the light 217a from LED 216a into the aperture 214. Mirror 220b substantially reflects light of wavelength $\lambda 2$ but substantially transmits light of wavelength $\lambda 3$, and this mirror is oriented to reflect the light 217b from LED 216b into the aperture 214. In some cases the mirror 220b may substantially reflect light of wavelength $\lambda 1$, while in other cases it may not. Mirror 220c substantially reflects light of wavelength $\lambda 3$, and is oriented to reflect the light 217c from LED 216c into the aperture 214. In some cases, the mirror 220c may substantially reflect light of wavelength $\lambda 1$, while in other cases it may not. Similarly, in some cases, the mirror 220c may substantially reflect light of wavelength $\lambda 2$, while in other cases it may not.

At least the mirrors 220a, 220b are designed to be dichroic mirrors, i.e., mirrors that have a high reflectivity (and low transmission) for some optical wavelengths, and a low reflectivity (and high transmission) for other optical wavelengths. Such mirrors ordinarily have negligible absorption, such that any light that is not reflected is substantially transmitted, and vice versa, at least over visible and near infrared wavelengths. Such mirrors comprise stacks of optically thin microlayers, typically in an alternating arrangement of materials having a large refractive index mismatch, such as alternating layers of silicon dioxide and titanium dioxide, but other suitable inorganic or organic materials may also be used. Such mirrors may be made by vacuum deposition of the alternating layers on a glass or other suitable substrate. Alternatively, suitable mirror films may be made by a continuous process that may involve coextrusion of alternating polymer materials and stretching the resulting multilayer polymer web, e.g. as described in U.S. Pat. Nos. 5,882,774 and 6,783,349. Regardless of the materials used in each dichroic mirror and the method of manufacture used, the mirror is provided with a layer thickness profile for the stack of microlayers that is tailored to provide the desired reflection characteristics as a function of wavelength, as described elsewhere herein. Reference in this regard is made to U.S. Pat. No. 6,967,778. The thickness profile may be tailored to provide a dichroic mirror that operates as a long pass filter, a short pass filter, or a notch filter, as desired.

The mirror 220c in FIG. 2 may be or comprise a dichroic mirror, or it may be a mirror of conventional design. For example, mirror 220c may be a conventional silver or aluminum coated substrate that substantially reflects light at all the wavelengths λ1, λ2, and λ3. Alternatively, mirror 220c may be or comprise a dichroic mirror that reflects light at wavelength λ3 but transmits light at wavelengths λ1 and λ2.

The mirrors 220a,b,c, optionally in combination with lenses, prisms, or other optical elements (not shown in the schematic depiction of FIG. 2) described elsewhere herein, operate to efficiently direct light from the different colored LEDs into a common aperture 214 formed in the substrate 212, such that light from those LEDs is mixed together to provide output light 217d that is broadband and, if desired, substantially white in appearance. The output light 217d includes light from each of the LED sources, and thus includes all of the peak wavelengths λ1, λ2, and λ3. In order to efficiently direct light from the LEDs into the aperture, the set of mirrors in combination with any lenses, prisms, or other optical elements may operate to produce a substantial image of each of the LEDs in the space occupied by the aperture.

Figure 2A:
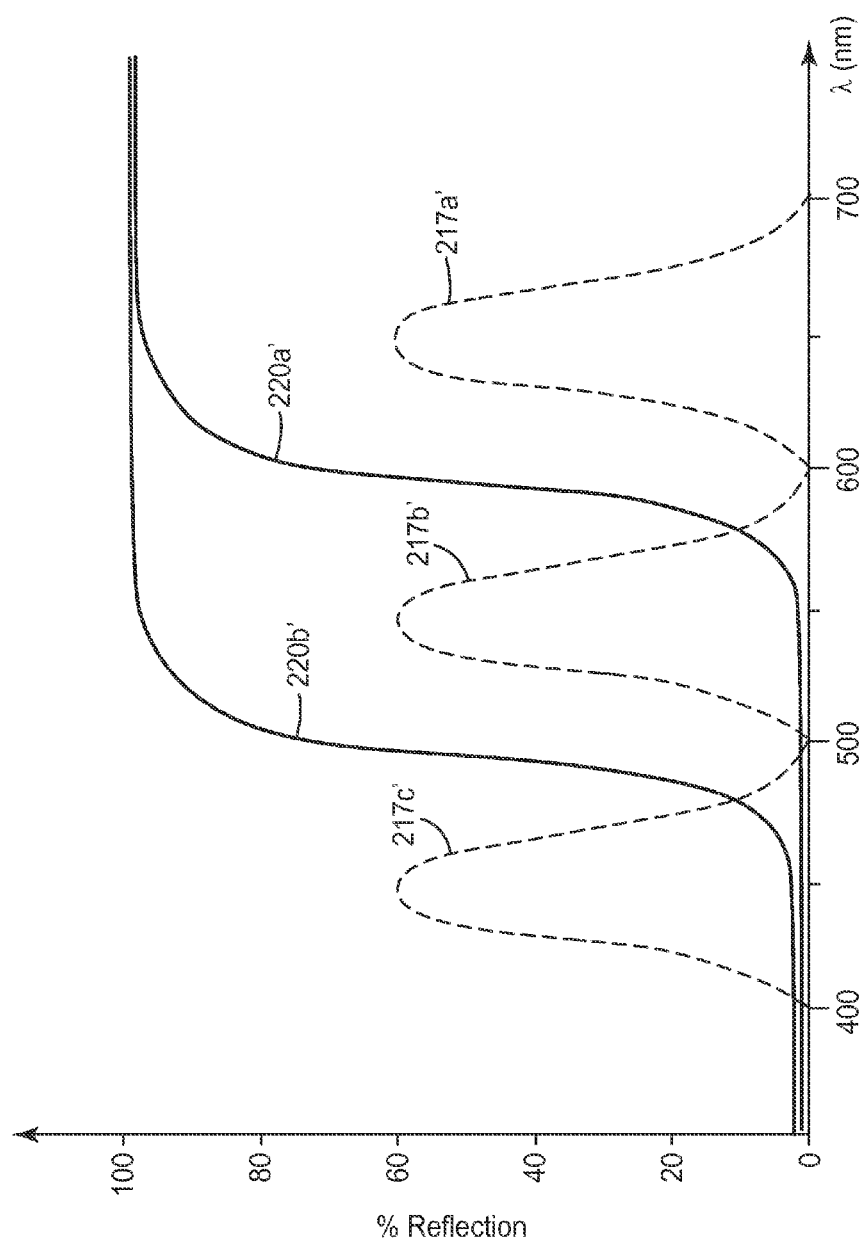
FIG. 2a is an idealized graph of dichroic mirror spectral reflectivity, on which is superimposed the emission spectra of idealized red, green, and blue LEDs.

Turning now to FIG. 2a, we see there an idealized graph of dichroic mirror spectral reflectivity, on which is superimposed the emission spectra of idealized red, green, and blue LEDs given by curves 217a', 217b', and 217c' respectively. The spectral reflectivity curves 220a', 220b' are assumed to represent low loss interference reflectors, such that the percent transmission is given by approximately 100% minus the percent reflection. Thus, for example, mirror 220a of FIG. 2 may be tailored to provide a spectral reflectivity 220a', which substantially reflects light of curve 217a' but substantially transmits light of curves 217b' and 217c'. Mirror 220b of FIG. 2 may be tailored to provide a spectral reflectivity 220b', which substantially reflects light of curve 217b' but substantially transmits light of curve 217c'. The mirror 220c of FIG. 2 may be tailored to provide a spectrally variable reflectivity similar to curves 220a' and 220b', or it may be of conventional design in which case it may simply have a high reflectivity, and substantially no transmission, over all relevant wavelengths.

Figure 3:
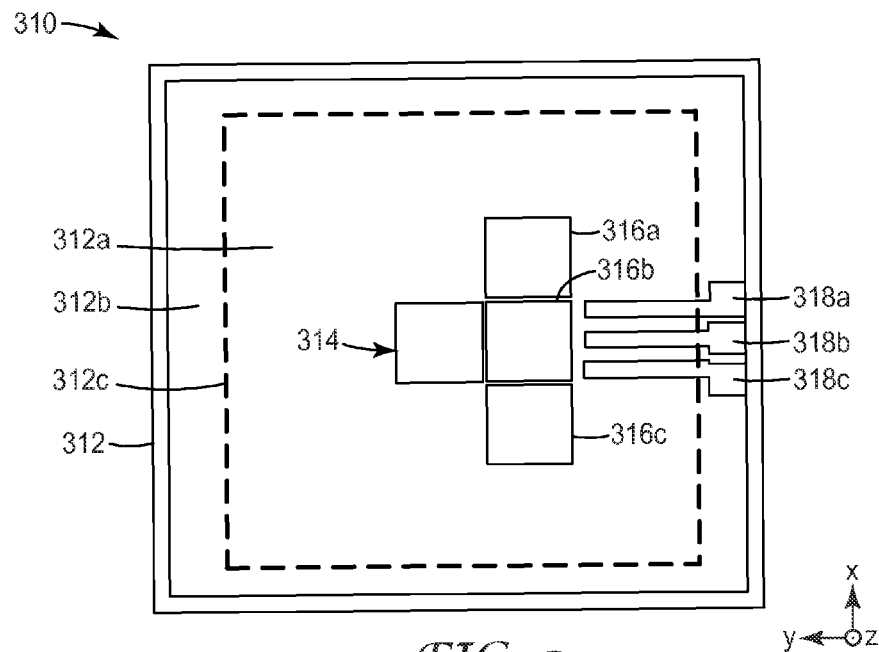
FIG. 3 is a schematic plan view of a portion of another broadband light source.

In FIG. 3, we see a schematic plan view of another component 310 which can form a key portion of a broadband light source. The component is depicted in the context of a Cartesian x-y-z coordinate system. The component 310 includes a flexible substrate 312 on which is mounted three distinct LEDs 316a, 316b, 316c. The substrate 312 desirably extends generally parallel to the x-y plane, and is preferably relatively thin along the orthogonal direction (z-axis) for flexibility, greater heat conduction (and lower thermal resistance) to an underlying heat sink (not shown), and for space savings. Although generally thin, the substrate 312 is molded, etched, or otherwise shaped to be even thinner in a cavity region 312a compared to an adjacent or neighboring region 312b, these regions optionally being separated by a transition region 312c. The reduced thickness, which provides an even greater heat conduction (and lower thermal resistance) in the cavity region relative to the neighboring region, is desirably associated with the reduced thickness of a dielectric layer which forms part of the substrate. The dielectric layer and other design details of exemplary substrates are described in more detail elsewhere herein.

An aperture 314 is also formed in the substrate 312. Design details of aperture 114 discussed above are equally applicable to aperture 314.

The LEDs 316a-c are arranged to be relatively close to the aperture, but unlike the LEDs shown in FIG. 1, the LEDs of FIG. 3 have different center-to-center distances relative to the aperture. In particular, the center-to-center distance for LED 316b is smaller than that of LEDs 316a, 316b. However, the center-to-center distance from each LED to the aperture is still preferably tailored to be no more than 3 times the width of the given LED, or no more than 2 times the width of the LED. Design details of LEDs 116a-c discussed above are equally applicable to LEDs 316a-c.

The substrate 312 is provided with electrically conductive patterned traces 318a, 318b, 318c, which may comprise a metal such as copper or other suitable materials. The traces 318a, 318b, 318c may be electrically connected to the respective LEDs 316a, 316b, 316c with wire bonds or by other suitable structures. The other ends of the traces may be connected to suitable power supplies so as to energize the LEDs by appropriate amounts to provide the desired total output power and color balance of the broadband light source.

Figure 4:
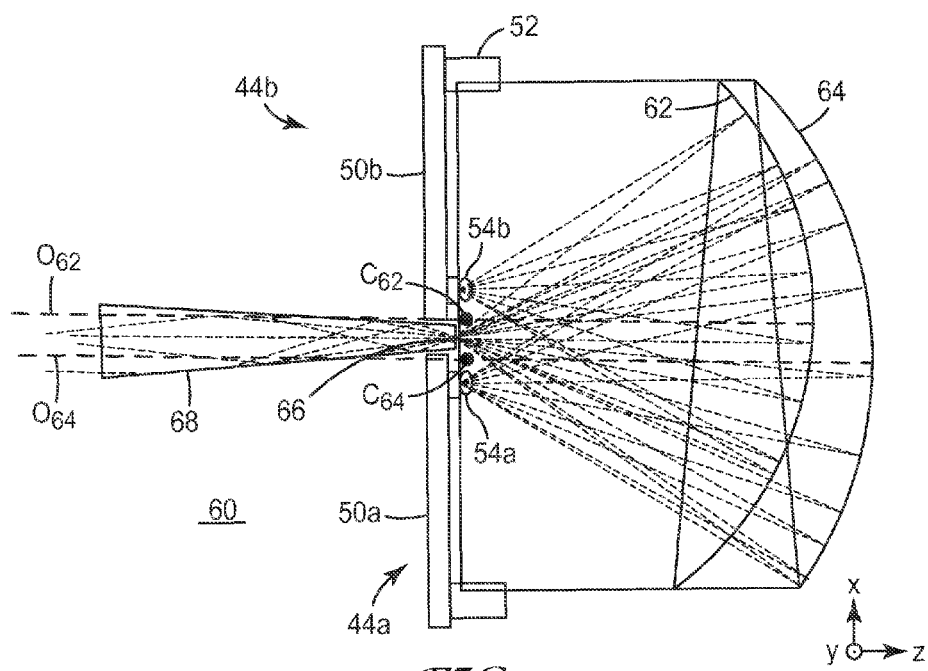
FIG. 4 is a schematic side or sectional view of a broadband light source.

FIG. 4 is a schematic side or sectional view of a broadband light source which may utilize some of the design features of the system described in U.S. Pat. No. 7,330,314 (Cobb), but which may incorporate any of the components and substrates discussed elsewhere herein. In brief, an illumination apparatus 60 uses a combination of two optical condenser systems 44a, 44b. In each respective optical condenser system 44a and 44b, source light is provided from one of two LED modules 50a, 50b. In optical condenser system 44b, LED module 50b has an LED package 54b that is placed to one side of the center of curvature C62 of a first curved reflective surface 62. Center of curvature C62 lies substantially half way between LED package 54b and an aperture 66. In optical condenser system 44a, LED module 50a has an LED package 54a that is placed to one side of the center of curvature C64 of a second curved reflective surface 64. With respect to either or both light sources, here LED packages 54a and 54b, second curved reflective surface 64 is considered to be behind first curved reflective surface 62. Center of curvature C64 lies substantially halfway between LED package 54a and aperture 66. Optical axes O62 and O64 for curved surfaces 62 and 64 are non-collinear.

Given this arrangement, then, the illumination apparatus 60 combines two optical condenser systems sharing aperture 66 in common. In optical condenser system 44a, LED package 54a may emit green light that passes through reflective surface 62 but is reflected and focused by reflective surface 64 onto the aperture 66. In the other optical condenser system 44b, LED package 54b on LED module 50b may emit red and blue light that is substantially reflected and focused by reflective surface 62 onto the aperture 66. The emitted light of both LED packages 54a and 54b propagates toward a first reflective curved surface 62 that is treated with a dichroic coating. This dichroic coating conditions partially reflective surface 62 to act as a type of bandpass filter, transmitting or passing a green spectral band and reflecting light outside this band. The spectral characteristics for this type of bandpass filter may include a very low reflectance, and correspondingly high transmission, for a spectral band around a central green wavelength (nominally about 525 nm), so that most of this light is transmitted through the dichroic surface.

In FIG. 4, reference numeral 52 refers to an electrical connector, and reference numeral 68 refers to an optional light homogenizer such as an integrator element or integrator bar, which may be used to homogenize or uniformize the emitted light from the aperture 66.

In the broadband light source of FIG. 4, the mirrors 62, 64 are shaped, arranged, and otherwise configured in such a way that they are capable of imaging the individual LEDs onto a common aperture 66 without the aid of any lenses or prisms. In an alternative arrangement to that of FIG. 4, the red-and-blue emitting LED 50b may be replaced with an LED that emits red light but not blue light, and a third LED that emits blue light may be mounted on the substrate near the aperture 66. Further, the first reflective curved surface 62 may be modified so that it transmits or passes both green light and blue light, and reflects red light. A third reflective curved surface may be added between surfaces 62, 64, the third curved surface being configured to transmit or pass green light but reflect blue light, the third curved surface also being arranged to image the third (blue emitting) LED onto the aperture 66.

Figure 5:
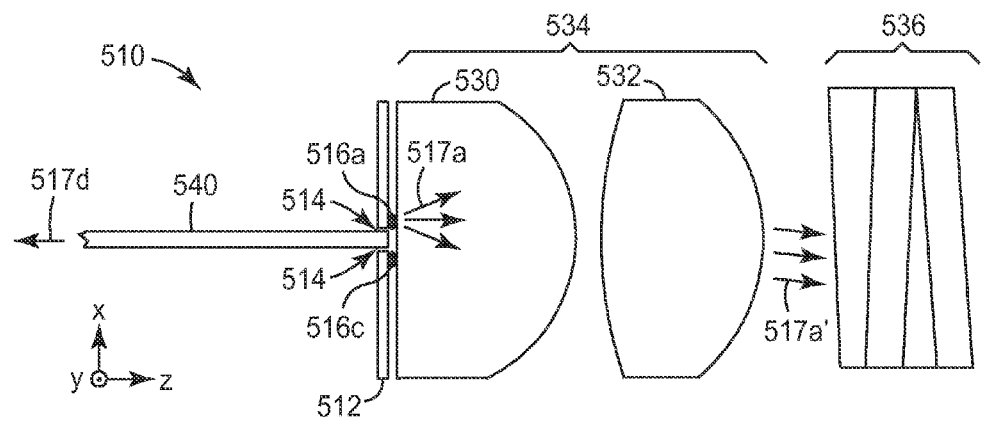
FIG. 5 is a schematic side or sectional view of another broadband light source.

FIG. 5 shows a schematic side or sectional view of another broadband light source 510. In this light source, flat mirrors are used rather than curved mirrors. In order to image the LEDs onto the common aperture using such mirrors, suitable lenses are added to provide collimating optics between the LEDs and the mirrors. The same lenses that collimate the light emitted by each LED receive the reflected (and collimated) light from the corresponding mirror, and focus that reflected collimated light at the common aperture in the plane of the LED. The reader will understand that the collimating optics need not exactly collimate light from any given LED, but that approximate collimation is usually sufficient so as to achieve adequate efficiencies in directing light from the LED into the aperture. The reader will also understand that light may be collimated (i.e., substantially collimated) while also propagating along a direction that is not parallel to the optical axis of the light source. In fact, in cases where the aperture is disposed at the optical axis of the light source (e.g. the optical axis of the collimating optics), each LED will be displaced transversely from the optical axis, and collimated light from each of the LEDs will propagate along directions that are not parallel, i.e. that are skewed, relative to the optical axis.

The light source 510 thus includes LEDs 516a, 516c disposed on a flexible substrate 512, the substrate also having an aperture 514 formed therein near the LEDs. Light 517a from one of the LEDs 516a is intercepted by lenses 530, 532, which function as collimating optics 534. Lens 530 is shown as a plano-convex lens and lens 532 is shown as a double convex lens, but other suitable lens designs can also be used. For example, one or more anamorphic lenses may be used to change the shape of the combined light beams on the substrate aperture. It can be advantageous to use a lens that has a planar surface adjacent to the LEDs for efficient coupling of the LED light into the lens. In some cases, there may be a small air gap between the LEDs and the adjacent lens surface. In some cases, a liquid or gel, such as an index matching fluid, may be used to fill the air gap so as to reduce reflection losses at the initial lens surface and at the LED surface to increase efficiency. In some cases, the lens that is closest to the LEDs may be or include an encapsulant that is formed by curing or otherwise solidifying an initially liquid material such as a suitable light-transmissive polymer or adhesive, the encapsulant being in optical contact with all exposed surfaces of each LED.

Regardless of which lens design is used for the collimating optics 534, the collimating optics collimates the light received from each LED, the light from LED 516a being collimated as light 517a'. The light 517a' is shown propagating along a direction that is not parallel to the optical axis of the source 510, such optical axis in this embodiment corresponding to an axis parallel to the z-axis and passing through the center of the aperture 514. The collimating optics 534 also collimates light from the other LEDs such as LED 516c, but that collimated light propagates along a direction different from light 517a' (and again non-parallel to the optical axis of the source 510) due to the transverse separation of the LEDs on the substrate.

The collimated light 517a' is then intercepted by a mirror assembly 536. The mirror assembly may be or include a collection of wedge-shaped plates whose major surfaces have been provided with suitable reflective coatings to provide one or more dichroic mirrors and an optional conventional mirror, as desired. Typically, a given major surface provided with a given reflective coating is responsible for reflecting light from a given one of the LEDs on the substrate, as was described in connection with FIG. 2. By virtue of this one-to-one correspondence of mirrors to LEDs, each mirror can be oriented to reflect light from its associated LED into the aperture, independent of the orientations of the other mirrors. Major surfaces of mirror assembly 536 are therefore depicted in FIG. 5 as being tilted relative to each other, and the reader will understand that this may not be diagrammatically accurate but that it schematically represents the mirrors being tilted or oriented along different directions as needed to reflect light from all of the different LEDs into the common aperture. In exemplary embodiments, the mirrors are all oriented in different directions, i.e., no two mirrors have the same orientation in three-dimensional space. For planar mirrors, this means that no two mirrors are parallel to each other.

Individual plates or components of the mirror assembly may be bonded to each other (e.g. along major surfaces of adjacent components) to provide a robust unitary assembly. Such a unitary assembly is shown in FIG. 5, and the mirrors within the assembly all have the proper relative orientation relative to each other so that, during manufacture, a single adjustment or alignment of the entire assembly results in all of the mirrors being correctly oriented simultaneously. Alternatively, the mirrors in the mirror assembly may be spaced apart from each other and separately mounted and aligned.

After the collimated light from each LED is reflected by its corresponding mirror in the mirror assembly 536, the reflected collimated light for each LED is re-focused by collimating optics 534 into the aperture 514. Since the different colored light from both or all of the various LEDs is directed into the same physical aperture, spatial mixing of those colors can occur to provide broadband output light, e.g. white light, of the light source. In some cases, the aperture itself may be considered to be the output port or output surface of the light source. In other cases, a fly's eye integrating system, diffuser, integrating rod, or other suitable optical element may be coupled to the aperture to provide the output light of the light source.

In FIG. 5, an integrating rod 540 is shown. The integrating rod receives the broadband light at the aperture 514, and directs the light along and out of the rod to provide broadband output light 517d. The integrating rod may be solid or hollow. The integrating rod may be made of a variety of low loss light-transmissive materials, including high refractive index materials, low refractive index materials, polymer materials, glass materials, and so forth. If the integrating rod is solid, its side surface(s) may be coated with a reflective material such as a metal. The input face of the integrating rod is preferably shaped to substantially fill the aperture in the substrate, and thus preferably has a plan view shape that is the same or similar to that of the aperture. The output face of the integrating rod may be the same size and shape as the input face, e.g., in cases where the integrating rod has a constant cross-sectional shape along its length. In other cases, the output face of the integrating rod may have an area that is larger or smaller than that of the input face. The cross-sectional shape or transverse dimension (e.g. width) of the integrating rod may thus change as a function of position along the length of the rod, with two exemplary functional relationships being a trapezoidal or parabolic profile, although other suitable profiles may also be used. In exemplary embodiments the integrating rod has a cross-sectional shape that is square or rectangular over all, or at least a majority, of its length, so as to generate the most mixing of light in the shortest integrating rod length. Preferably, the integrating rod provides output light at its output surface whose etendue is approximately the same as the etendue of the light impinging on the aperture in the substrate. In some cases the integrating rod may have an optical axis that is aligned and coincident with an optical axis of the remainder of the light source, e.g., with the optical axis of collimating optics 534, and/or with an axis that is perpendicular to the substrate 512. In other cases, the optical axis of the integrating rod may be tilted (non-parallel) with regard to those other axes in order to minimize etendue of the light source system, and/or to improve the optical layout of the system.

The integrating rod or other component disposed at the aperture may be bonded to the substrate with an adhesive, e.g., a low refractive index material such as methyl silicone to promote total internal reflection at the side surface of the rod.

One beneficial design aspect of the optical design of both the broadband light source of FIG. 4 and the broadband light source of FIG. 5 is that the light from the LEDs is made to impinge on the mirrors at angles that are close to normal incidence, e.g., angles of incidence that are much less than 45 degrees. Keeping the angle of incidence of light impinging on the mirrors small avoids problems associated with differences in reflectivity for light polarized in the plane of incidence (p-polarized light) compared to light polarized perpendicular to the plane of incidence (s-polarized light). Mirrors that comprise multilayer stacks or packets of microlayers that reflect light by constructive or destructive interference, e.g., many types of dichroic mirrors, have reflectivities and associated transmissivities that may differ significantly for s- and p-polarized light if the angle of incidence differs substantially from zero degrees (normal incidence). Such mirrors may also produce, at high incidence angles, undesirable phase shifts of reflected light relative to transmitted light over the light cone angle.

Figure 6:
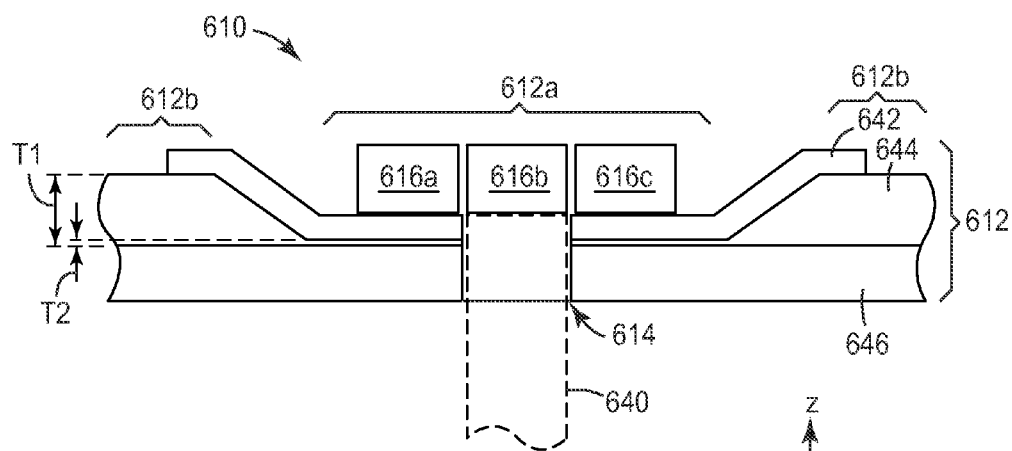
FIG. 6 is a schematic side or sectional view of a portion of a broadband light source.

Turning now to FIG. 6, we see there a schematic side or sectional view of a component 610 which can form a key portion of a broadband light source, such as any of the sources described in connection with FIG. 2, 4, or 5. The component is depicted in the context of a Cartesian x-y-z coordinate system which is oriented consistently with other figures herein. In FIG. 6, we show design details of the flexible substrate that can be beneficially employed in the disclosed broadband light sources.

The component 610 includes a flexible substrate 612 on which is mounted three distinct LEDs 616a, 616b, 616c. The LEDs 616a-c are preferably arranged to be relatively close to the aperture 614 formed in the substrate, and may be arranged on the substrate along with the aperture in any suitable fashion, including any of the ways shown or described in connection with FIG. 1 or 3. The center-to-center distance from each LED to the aperture is preferably tailored to be no more than 3 times the width of the given LED, or no more than 2 times the width of the LED. Design details of LEDs discussed above are equally applicable to LEDs 616a-c.

The substrate 612 desirably extends generally parallel to the x-y plane, and is preferably relatively thin along the orthogonal direction (z-axis) for flexibility, greater heat conduction to an underlying heat sink (not shown), and for space savings. Although generally thin, the substrate 612 is molded, etched, or otherwise shaped to be even thinner in a cavity region 612a compared to adjacent or neighboring regions 612b, these regions being shown as separated by a beveled transition region. The reduced thickness, which provides an even greater heat conduction in the cavity region relative to the neighboring region, is desirably associated with the reduced thickness of a dielectric layer 644 which forms part of the substrate. In the figure, the dielectric layer 644 is shown to have a thickness T1 in the neighboring regions 612b, and a smaller thickness T2 in the cavity region 612a. Disposed atop the dielectric layer 644 is an electrically conductive layer 642, which may be patterned as desired to provide power to the LEDs. A thermally conductive layer 646 is disposed on an opposite major surface of the dielectric layer compared to layer 642. In some cases, the layers 642, 646 may be composed of the same material, e.g., copper, while in other cases different materials may be used. Thus, the electrically conductive layer 646 may also be thermally conductive, and the thermally conductive layer 646 may also be electrically conductive. The thermally conductive layer 646 is preferably bonded to a suitable heat sink, through which another aperture may be provided to accommodate an optional integrating rod. Such an integrating rod 640 is shown inserted into the aperture 614 to collect and mix the light from the various LEDs to provide output light for the light source.

As mentioned previously, the thinned region of the substrate 612 is preferably associated with a corresponding thinned region of the dielectric layer 644, which is in many cases a key structural component of the substrate. Suitable dielectric layers include polyesters, polycarbonates, liquid crystal polymers, and polyimides. Suitable polyimides include those available under the trade names KAPTON, available from DuPont; APICAL, available from Kaneka Texas corporation; SKC Kolon PI, available from SKC Kolon PI Inc.; and UPILEX and UPISEL, available from Ube Industries. Polyimides available under the trade designations UPILEX S, UPILEX SN, and UPISEL VT, all available from Ube Industries, Japan, are particularly advantageous in many applications. These polyimides are made from monomers such as biphenyl tetracarboxylic dianhydride (BPDA) and phenyl diamine (PDA).

The dielectric layer 644 may be thinned in the cavity region using any suitable method such as chemical etching, plasma etching, focused ion-beam etching, laser ablation, and punching. With regard to etching, any suitable etchant may be used, and the preferred etchant may depend on the material(s) used in the dielectric layer. Suitable etchants may include alkali metal salts, e.g. potassium hydroxide; alkali metal salts with one or both of solubilizers, e.g., amines, and alcohols, such as ethylene glycol. Suitable chemical etchants may include KOH/ethanol amine/ethylene glycol etchants such as those described in more detail in U.S. Patent Publication US 2007/0120089, incorporated herein by reference. Other suitable chemical etchants may include KOH/glycine etchants such as those described in more detail in commonly assigned U.S. patent application 61/409,791, filed Nov. 3, 2010, incorporated herein by reference. After etching, the dielectric layer may be treated with an alkaline KOH/potassium permanganate (PPM) solution, e.g., a solution of about 0.7 to about 1.0 wt % KOH and about 3 wt % KMnO4. The dielectric layers may be clad on one or both sides with a conductive layer, e.g., layers 642 and 646 of FIG. 6. The conductive layers may be composed of any suitable electrically and/or thermally conductive materials, but typically comprise copper. If the conductive layer(s) are to be formed into circuits, they may be pre-patterned, or may be patterned during the process of making the flexible light emitting semiconductor devices. In some cases, the flexible substrate may have a multilayer construction, including multiple layers of dielectric material and conductive material in a stacked arrangement.

The type of thinning procedure used can affect the transition between the cavity region and the neighboring region, as well as the characteristics of the side walls of the dielectric layer and other layers in the transition region. Chemical etching can be used to produce relatively shallow side walls, e.g., typical side wall angles in a range from about 5 to 60 degrees measured from the plane of the flexible substrate, or from about 25 to 28 degrees. Other techniques, such as punching, plasma etching, focused ion-beam etching, and laser ablation, may produce much steeper side walls, e.g. wall angles up to about 90 degrees. In some cases, such as with punching, a hole may be formed completely through the dielectric layer, which is discussed further below. In such cases, other layers of the flexible substrate, such as conductive layers 642 and/or 646, may be utilized to provide physical support for the LEDs in the cavity region.

In exemplary embodiments, the dielectric layer is significantly thinner in the cavity region 612a compared to the neighboring region 612b to increase heat conduction away from the LEDs and to maintain the LEDs at cooler operating temperatures. For example, the thickness T2 may be about 5 to 25% of T1. Furthermore, T2 may be greater than zero but no more than 10 microns, while T1 may be at least 20 microns. In exemplary embodiments, T1 may be no more than 200 microns. In addition to increasing heat conduction, the thinned nature of the cavity region can provide other advantages such as the formation of slanted side walls, which may be coated with a reflecting material to provide enhanced efficiency. Also, by attaching the LEDs to the substrate in the thinned cavity region, the LEDs do not extend as high above the plane of the flexible substrate, producing a lower profile device that is better suited for low form factor applications.

Additional design details of exemplary flexible substrates suitable for use in the disclosed embodiments can be found in the following commonly owned U.S. patent applications, which are incorporated herein by reference: U.S. application 61/409,796, filed Nov. 3, 2010; U.S. application 61/409,801, filed Nov. 3, 2010. The dielectric layer and other design details of exemplary substrates are described in more detail elsewhere herein.

Figure 7:
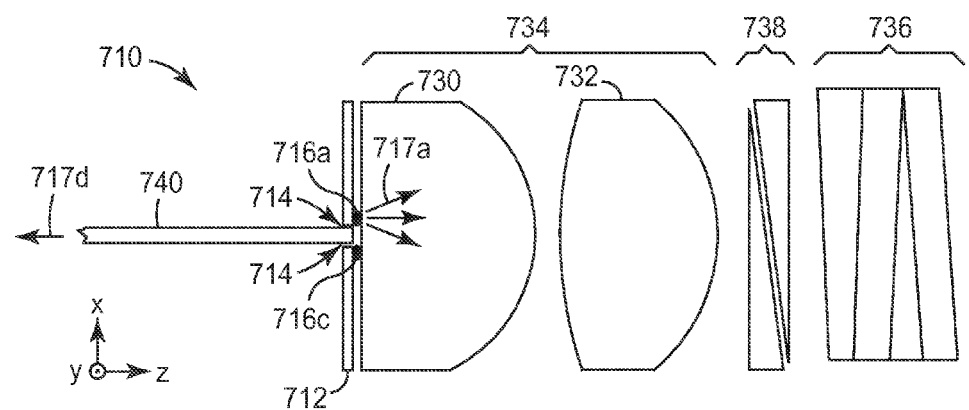
FIG. 7 is a schematic side or sectional view of a broadband light source capable of providing a polarized light output.

FIG. 7 shows a schematic side or sectional view of a broadband light source 710 capable of providing a polarized light output. The source 710 is similar in many respects to the source 510 of FIG. 5, but a polarization separation prism assembly is inserted between the collimating optics and the mirror assembly, and the aperture in the flexible substrate is lengthened along one in-plane axis and the integrating rod is correspondingly extended along that in-plane axis.

Like the source of FIG. 5, light source 710 utilizes flat mirrors rather than curved mirrors, and collimating optics between the LEDs and the mirrors. However, an alternative polarized light source may be made by combining features of light source 710 with curved mirror features of the source shown in FIG. 4. LEDs 716a, 716c are disposed on a flexible substrate 712, the substrate also having an aperture 714 formed therein near the LEDs. The aperture 714 is larger than the aperture 514 of FIG. 5, e.g., twice the width along the in-plane x-direction but nominally the same width along the in-plane y-direction, assuming the LEDs of FIG. 7 are the same size as those of FIG. 5. Light 717a from one of the LEDs 716a is intercepted by lenses 730, 732, which function as collimating optics 734. Design aspects discussed in connection with collimating optics 534 apply equally to collimating optics 734, and need not be discussed further here. The collimating optics collimates the light received from each LED, with collimated light from the LEDs propagating along slightly different directions.

Before this collimated light—which is unpolarized—is intercepted by the mirror assembly 736, it encounters a polarization separation prism assembly 738. This assembly may be or include, for example, one or more Wollaston prisms, Senarmont prisms, Nicol prisms, Rochon prisms, Nomarski prisms, or the like. Such a prism assembly operates to separate orthogonal polarization components of an arbitrary unpolarized light beam by deflecting the orthogonal polarizations along a given axis or direction. The deflection angle between the propagation directions of the two polarizations may be tailored via the design of the prisms used. In source 710, the prism assembly 738 is oriented to deflect the two polarizations (for each of the collimated beams from each LED) along the x-axis by an amount tailored to produce two images of each LED that are disposed side-by-side (or end-to-end) at the plane of the substrate, the two images being made with orthogonal polarizations of light. Thus, each LED on the substrate 712 produces one collimated unpolarized beam between the collimating optics and the prism assembly, each such collimated unpolarized beam splitting into two collimated polarized beams between the prism assembly 738 and the mirror assembly 736. The two collimated orthogonally polarized beams of a given color or wavelength are then reflected by the mirror in mirror assembly 736 that is tailored to reflect that color or wavelength of light. As explained above, the different mirrors of the mirror assembly 736 are oriented differently so as to direct light from their associated LEDs (at a given wavelength or wavelength range) onto the aperture. Other design features discussed in connection with mirror assembly 536, of course, apply equally to mirror assembly 736. In the case of source 710, the aperture 714 is twice as long as it would otherwise be because the prism assembly 738 has the effect of splitting the broadband image at the plane of the substrate into two broadband images of orthogonal polarizations, the two images being disposed end-to-end or side-by-side.

The light source 710 thus produces two broadband images at the plane of the substrate in the extended aperture 714, the two images being spatially separated and of orthogonal polarizations. If an ordinary integrating rod is placed at the aperture to collect all the light in the aperture, the effort expended in producing separately polarized images will be lost since light from the two images will be mixed in the integrating rod, and output light 717d exiting the output face of the integrating rod will be unpolarized. Instead, we propose to place a half-wave retarder element in the aperture 714, where the retarder element is sized to fill only half of the aperture, and the retarder element is disposed and oriented to change the polarization state of one image to an orthogonal polarization so as to match the polarization state of the adjacent image. In this way, broadband light of a single polarization state can be made to fill the entire aperture 714. With such a retarder element in position, an integrating rod 740 can be inserted into the aperture 714 at the output of the retarder element, such that all of the light entering the input face of the rod 740 is of the same polarization state. If the rod 740 is appropriately designed, e.g., if it has a square or rectangular cross sectional shape rather than a circular shape, this polarization state may be substantially preserved so that the output light 717d of the light source 710 will be both broadband and polarized. (Even square or rectangular-shaped integrating rods can depolarize light due to the effects of skew rays. These skew ray depolarizing effects can be minimized by keeping the length of the integrating rod as short as possible.) With this caveat in mind, other design aspects discussed in connection with integrating rod 540 should be considered to apply equally to integrating rod 740.

The half-wave retarder may be made from quartz or other materials commonly used for retarder plates. Preferably, the retarder is achromatic or apochromatic, and also preferably, it has a wide acceptance angle range. An example of a suitable wide angle retarder is one made from quartz and sapphire. The sides of the retarder may be metalized to reflect light that is incident on the side walls of the retarder. The sides may also be polished to specularly reflect any light.

With regard to polarization separation prism assemblies, as mentioned above, Wollaston prisms, Senarmont prisms, Nicol prisms, Rochon prisms, Nomarski prisms, or the like, may be used. A single birefringent prism may be used, as well as combinations of the prisms. The birefringent prism, such as a Wollaston prism, may be made by conventional means using calcite or another birefringent mineral, or may be made from birefringent polymers or liquid crystals. In one particular embodiment, a suitable design is to make the prisms from uniaxially oriented polyethylene terephthalate (PET), polyethylene naphthalate (PEN), or another birefringent polymer. Combinations of two or more birefringent materials may be use to reduce the dispersion of the prisms. In some cases, the individual birefringent prisms may each be made from a single sheet of birefringent material, or they may be made from a bonded stack of layers or films of birefringent material. The bonding layer, if used, is preferably very thin, typically one fifth or less of the thickness of the birefringent layers.

Figure 8:
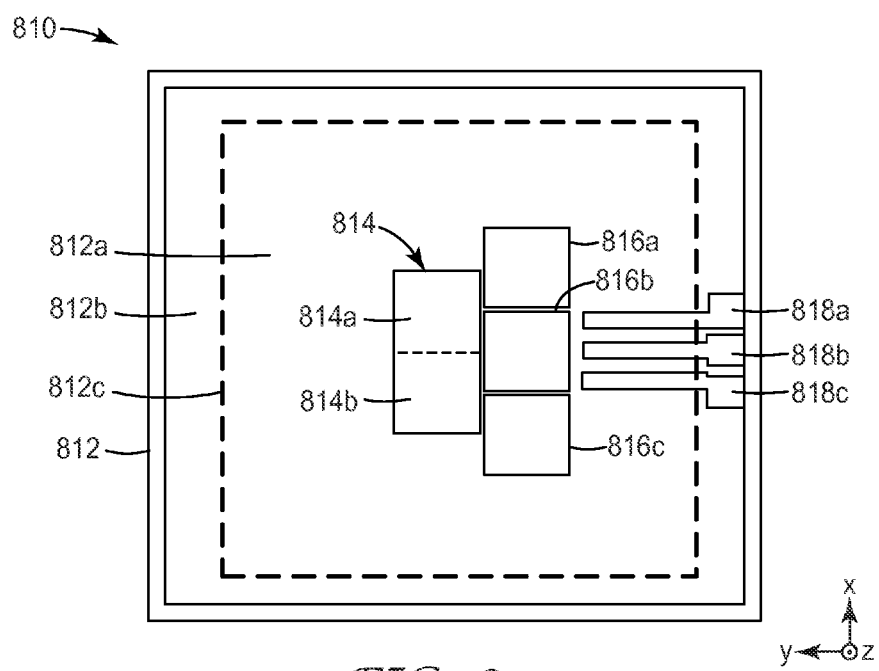
FIG. 8 is a schematic plan view of a portion of another broadband light source.

FIG. 8 is a schematic plan view of a component 810 which can form a key portion of a broadband light source. The component 810 is similar in many respects to those of FIGS. 1 and 3, but has been modified to be useable in polarized light sources such as those described in connection with FIG. 7. A Cartesian x-y-z coordinate system, consistent with that of FIG. 7, is also shown. The component 810 includes a flexible substrate 812 on which is mounted three LEDs 816a, 816b, 816c. The substrate 812 desirably extends generally parallel to the x-y plane, and is preferably relatively thin along the orthogonal direction (z-axis) for flexibility, greater heat conduction to an underlying heat sink, and for space savings. Although generally thin, the substrate 812 is molded, etched, or otherwise shaped as described elsewhere herein to be even thinner in a cavity region 812a compared to an adjacent or neighboring region 812b, these regions optionally being separated by a transition region 812c. The reduced thickness, which provides an even greater heat conduction in the cavity region relative to the neighboring region, is desirably associated with the reduced thickness of a dielectric layer which forms part of the substrate. The dielectric layer and other design details of exemplary substrates are described in more detail elsewhere herein.

An aperture 814 is also formed in the substrate 812. Design details of the apertures discussed above are equally applicable to aperture 814, except that aperture 814 is extended along the x-direction to form a first aperture portion 814a and a second aperture portion 814b which preferably abuts portion 814a. The portions 814a,b may each have the same size and outer shape as the size and shape of any of the LEDs 816a-c. Thus, if the LEDs have a square outer profile, then portions 814a,b may also be square, and aperture 814 may be a rectangle having a 1:2 aspect ratio.

The LEDs 816a-c are arranged to be relatively close to the aperture 814, but have different center-to-center distances relative to the aperture. In particular, the center-to-center distance for LED 816b is smaller than that of LEDs 816a, 816c. However, the center-to-center distance from each LED to the aperture is still preferably tailored to be no more than 3 times the width of the given LED, or no more than 2 times the width of the LED. Design details of LEDs discussed elsewhere herein are equally applicable to LEDs 816a-c.

The substrate 812 is provided with electrically conductive patterned traces 818a, 818b, 818c, which may comprise a metal such as copper or other suitable materials. The traces 818a, 818b, 818c may be electrically connected to the respective LEDs 816a, 816b, 816c with wire bonds or by other suitable structures. The other ends of the traces may be connected to suitable power supplies so as to energize the LEDs by appropriate amounts to provide the desired total output power and color balance of the broadband light source.

Figure 9A:
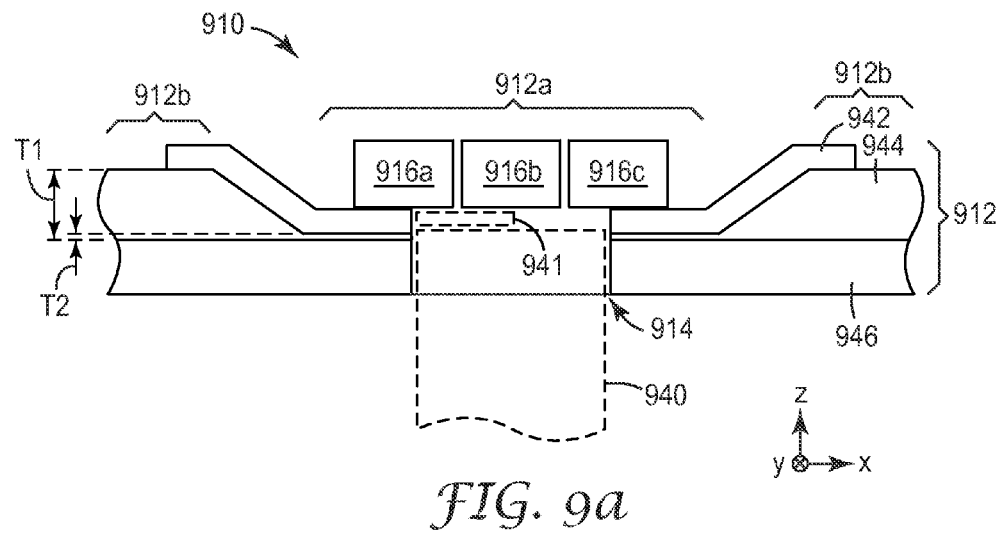
FIG. 9a is a schematic side or sectional view of a portion of a broadband light source capable of providing a polarized light output.

FIG. 9a is a schematic side or sectional view of a component 910 which can form a key portion of a broadband light source, including the broadband polarized light source of FIG. 7. The component is depicted in the context of a Cartesian x-y-z coordinate system which is oriented consistently with other figures herein, including FIGS. 7 and 8. FIG. 9a shows design details of the flexible substrate similar to the design details shown and discussed in connection with FIG. 6.

The component 910 includes a flexible substrate 912 on which is mounted three LEDs 916a, 916b, 916c. The LEDs 916a-c are preferably arranged to be relatively close to the aperture 914 formed in the substrate, and may be arranged on the substrate along with the aperture in any suitable fashion, including the arrangement shown in FIG. 8. The center-to-center distance from each LED to the aperture is preferably tailored to be no more than 3 times the width of the given LED, or no more than 2 times the width of the LED. Design details of LEDs discussed elsewhere herein apply equally to LEDs 916a-c.

The substrate 912 desirably extends generally parallel to the x-y plane, and is preferably relatively thin along the orthogonal direction (z-axis) for flexibility, greater heat conduction to an underlying heat sink, and for space savings. Although generally thin, the substrate 912 is molded, etched, or otherwise shaped as described elsewhere herein to be even thinner in a cavity region 912a compared to adjacent or neighboring regions 912b, these regions being shown as separated by a beveled transition region. The reduced thickness, which provides an even greater heat conduction in the cavity region relative to the neighboring region, is desirably associated with the reduced thickness of a dielectric layer 944 which forms part of the substrate. In the figure, the dielectric layer 944 is shown to have a thickness T1 in the neighboring regions 912b, and a smaller thickness T2 in the cavity region 912a. Disposed atop the dielectric layer 944 is an electrically conductive layer 942, which may be patterned as desired to provide power to the LEDs. A thermally conductive layer 946 is disposed on an opposite major surface of the dielectric layer compared to layer 942. In some cases, the layers 942, 946 may be composed of the same material, e.g., copper, while in other cases different materials may be used. Design details of substrates discussed in connection with FIG. 6, including design details of the dielectric layer, preferred relationships involving T1 and T2, and design details of electrically conductive layers and thermally conductive layers, are equally applicable to the embodiment of FIG. 9a.

The aperture 914 is extended along the x-direction, in the same way as apertures 714 and 814 are extended along the x-direction to accommodate the side-to-side or end-to-end images of opposite polarization produced by a polarization separation device such as prism assembly 738. One of these polarized images occupies one half of aperture 914, and the oppositely polarized image occupies the other half of the aperture. In FIG. 9a, a half-wave optical retarder 941 is shown to be placed in the aperture 914, the retarder 941 occupying the half of the aperture corresponding to one of the polarized images. The retarder 941 is oriented to change the polarization state of the image to an orthogonal polarization so as to match the polarization state of the adjacent image that is disposed in the portion of aperture 914 not occupied by the retarder 941. In reference to the top plan view of FIG. 8, the retarder 941 may occupy only the aperture portion 814a.

An optional integrating rod 940 is shown inserted into the aperture 914 at the output of retarder 941. In that configuration, the input face of the rod 940 receives broadband light from all of the LEDs, the light having substantially a single polarization state over the entire input face of the rod 940. The integrating rod 940 is preferably designed as discussed elsewhere herein to preserve that polarization state so that the output face of the integrating rod 940 provides output light for the light source that is not only broadband, but also polarized. As an alternative to integrating rod 940, the output light from the aperture 914 may couple directly to another optical system with no integrating rod therebetween. In another alternative, a fly-eye integrator may be inserted in the aperture 914, or place a specified distance away from the aperture. Fly-eye integrators can maintain optical polarization if they are made from low birefringence materials.

Figure 9B:
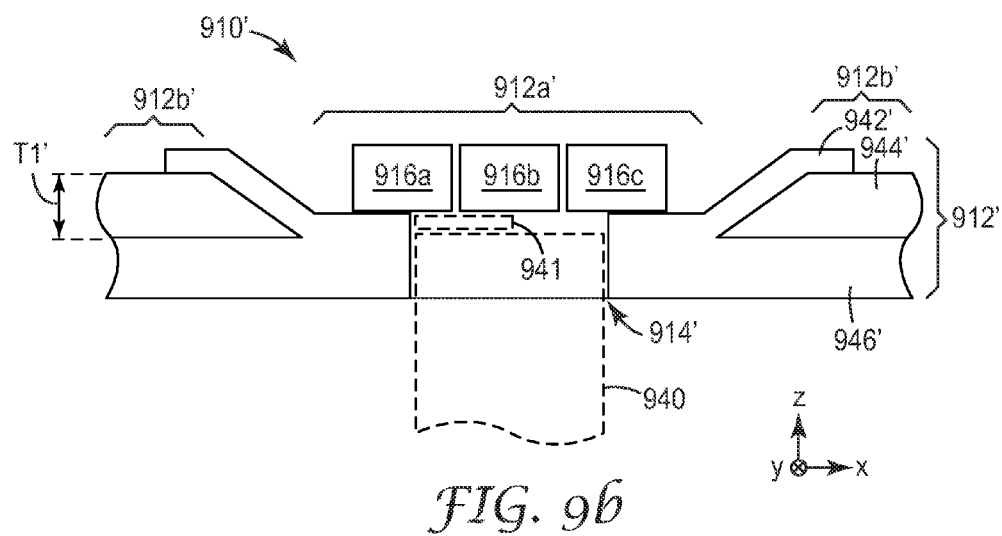
FIG. 9b is a schematic side or sectional view of a portion of another broadband light source capable of providing a polarized light output.

FIG. 9b is a schematic side or sectional view of a component 910' which can form a key portion of a broadband light source, including the broadband polarized light source of FIG. 7. The component 910' is similar in many respects to component 910 of FIG. 9a, with like elements having like reference numerals, such elements requiring no further explanation to avoid unnecessary duplication.

Component 910' differs from component 910 chiefly by virtue of the dielectric layer 944' of the flexible substrate 912' having a hole or "via" that extends completely through the dielectric layer. Thus, no portion of the dielectric layer 944' remains in the cavity region 912a', and the thickness of the dielectric layer in that region (see T2 in FIG. 9a) can be considered to be zero. The thickness of the dielectric layer 944 in the neighboring region 912b' is T1', which may be the same as or similar to thickness T1 of FIG. 9a. The aperture 914', which extends through the flexible substrate 912', may be the same as or similar to aperture 914 of FIG. 9a.

Disposed atop the dielectric layer 944' is an electrically conductive layer 942', which may be the same as or similar to layer 942 of FIG. 9a. A thermally conductive layer 946' is disposed on an opposite major surface of the dielectric layer compared to layer 942', and this thermally conductive layer may be the same as or similar to layer 946 of FIG. 9a. One or both of layers 942', 946' are configured to provide physical support for the LEDs in the cavity region 912a', in view of the absence of dielectric layer 944' in that region.

The characterizing feature of component 910', wherein a hole extends completely through the dielectric layer in the cavity region, may also be applied to other embodiments discussed herein, including the component 610 discussed in connection with FIG. 6. Thus, for example, just as component 910 can be modified to produce component 910', so also component 610 of FIG. 6 can be modified to produce a corresponding component in which the dielectric layer has a hole or "via" extending completely through it in the cavity region, such that T2=0.

Further design details of LED color combiners, including polarized LED color combiners, as well as other pertinent design information, can be found in commonly assigned U.S. application 61/428,032, filed on even date herewith, incorporated herein by reference.

Now, in connection with FIGS. 10, 10a, 10b, 10c, and 10d, we will describe in more detail light source designs in which an integrating rod is provided at the substrate aperture, but where the rod is tilted relative to the optical axis of the light source so as to provide reduced etendue and/or other beneficial design features.

Figure 10:
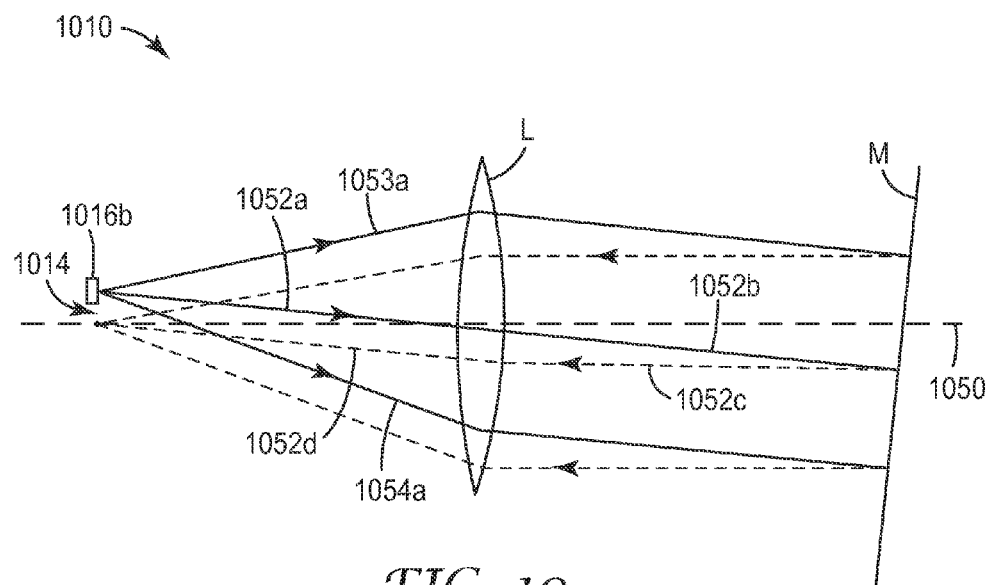
FIG. 10 is a schematic side or sectional view of a broadband light source.

In FIG. 10 we see a lighting system 1010 in which light from an LED 1016b is collimated by a lens L and reflected by a mirror M to a spot on an aperture 1014. Rays 1052a, 1053a, 1054a represent light rays emitted by the LED. Ray 1052a can be considered to be a principal ray because it passes through the center of the pupil at lens L. Ray 1052a is substantially undeviated by lens L to produce ray 1052b, which is reflected by the suitably oriented mirror M as ray 1052c, the ray 1052c then being deviated by the lens L into the aperture 1014. Reference number 1050 identifies the optical axis of the system 1010 and the lens L.

Figure 10A:
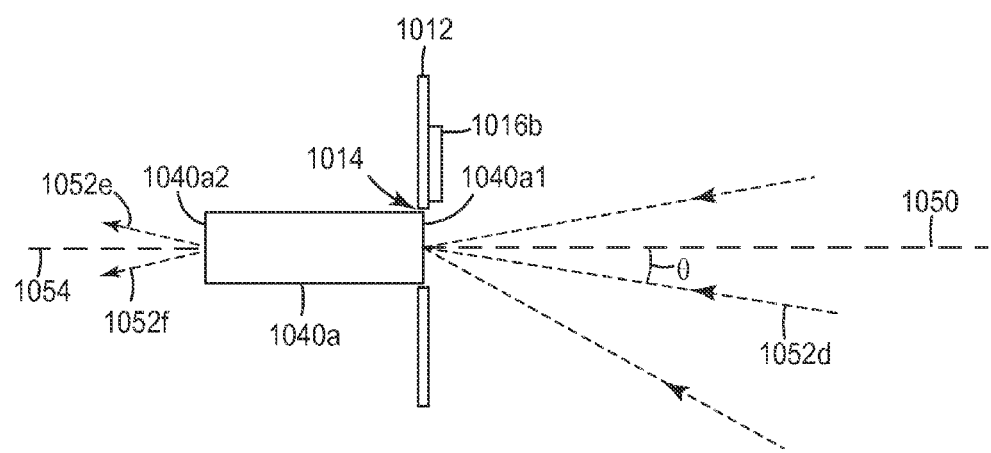
FIG. 10a is a schematic side or sectional view of a portion of the light source of FIG. 10 in the vicinity of the LED and aperture, in which an integrating rod is aligned with the optical axis of the light source.

In FIG. 10a we see a close-up view of the portion of the system 1010 near the LED 1016b and the aperture 1014. The ray 1052d from FIG. 10 is shown making an angle θ relative to the optical axis 1050. That ray, and other light rays that originated from the LED 1016b and have been reflected by mirror M and focused by lens L, enter the aperture 1014, at which is placed an integrating rod 1040a. In particular, an input face 1040a1 of the integrating rod, which substantially fills the aperture 1014 and has the same shape (e.g. square) as the aperture in plan view, receives the light that falls within the aperture. In this case, the integrating rod 1040a is oriented perpendicular to the substrate 1012, such that an optical axis 1054 of the rod is parallel to (and coincident with) the optical axis 1050 of the system. Light propagates through the rod 1040a and exits the rod through an output face 1040a2. Light from the LED 1016b exits the face 1040 in two lobes, one centered about ray 1052e and the other centered about ray 1052f. Rays 1052e and 1052f are each oriented at the angle θ relative to the optical axis 1054 of the integrating rod. Note that substrate 1012 is shown only schematically, but preferably has design features of other flexible substrates discussed herein.

Figure 10B:
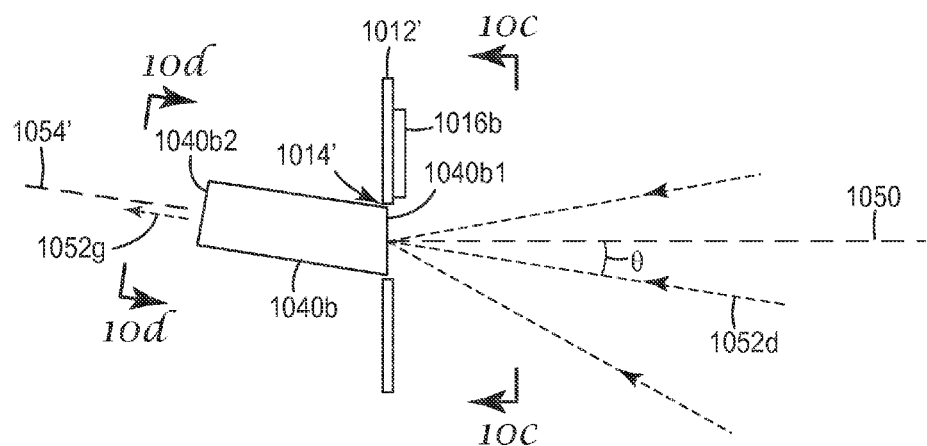
FIG. 10b is a schematic side or sectional view of an alternative embodiment to that of FIG. 10a, in which an integrating rod is tilted with respect to the optical axis of the light source.

FIG. 10b depicts the same region shown in FIG. 10a, but where the integrating rod 1040a has been replaced with an alternative rod 1040b that is tilted relative to the system optical axis 1050. The substrate 1012' and its aperture 1014' may be the same as corresponding elements 1012, 1014 of FIG. 10a, or the aperture 1014' may be slightly changed (e.g. bounded by beveled side walls) to better accommodate the tilted rod 1040b. The rod 1040b extends along an optical axis 1054' which is now no longer parallel to the axis 1050 but is oriented at an angle relative thereto, e.g., an angle of approximately θ. The input face 1040b1 of rod 1040b may if desired be oriented so as to be normal to axis 1050 (and parallel to the substrate 1012') rather than normal to the axis 1054'. Alternatively, the input face may be oriented to be normal to optical axis 1054', or may be at an intermediate position that is neither normal to axis 1054' nor normal to axis 1050. In any case, light ray 1052d, and other light rays that originated from the LED 1016b and have been reflected by mirror M and focused by lens L, enter the aperture 1014', at which is placed the integrating rod 1040b. The input face 1040b1 of the integrating rod, which substantially fills the aperture 1014' and has the same shape (e.g. square) as the aperture in plan view, receives the light that falls within the aperture. In this case, light from LED 1016b propagates through the rod 1040b and exits the rod through an output face 1040b2, which may be oriented perpendicular to the rod optical axis 1054' and which thus may be non-parallel or tilted relative to the input face 1040b1.

Figure 10C:
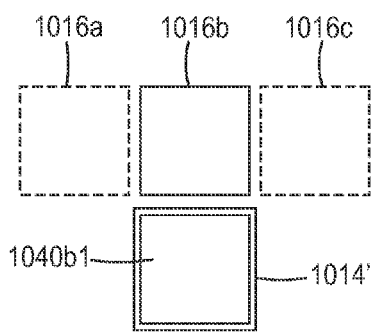
FIGS. 10c and 10d are views along lines 10c-10c and 10d-10d, respectively, in FIG. 10b.
Figure 10D:
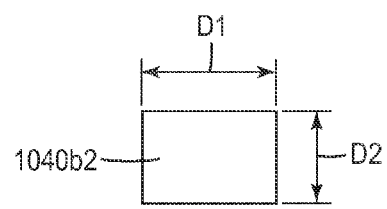

As a result of tilting the integrating rod relative to the optical axis 1050, light from the LED 1016 may exit the output face 1040b2 in a single lobe 1052g, or in two lobes whose principal directions are angularly separated from each other by a much smaller angle than the output lobes 1052e, 1052f depicted in FIG. 10a. This reduction in angular separation helps to reduce the etendue (and increase the brightness) of the lighting system, particularly if all of the LEDs in the lighting system 1010 are arranged on the substrate such that the output light from all of the LED sources exits the integrating rod along the same or similar directions. Such a situation may occur when the LEDs are asymmetrically arranged relative to the aperture, as shown in the view of FIG. 8 or 10c. Here, the LED 1016b, which may for example emit green light, is combined with LEDs 1016a, 1016b, which may for example emit red and blue light respectively, and the LEDs 1016a, 1016b, 1016c are arranged in a row on one side of the aperture 1014' rather than symmetrically about the aperture. The input face 1040b1 of the integrating rod can be seen to substantially fill the aperture 1014'. As a result of the tilt, the rod 1040b may have a cross-sectional area (as measured in a plane perpendicular to the optical axis of the rod) that is smaller than the cross-sectional area of a non-tilted rod such as that of FIG. 10a. The reduced cross-sectional area is a result of a smaller transverse dimension D2 in the plane of FIG. 10b compared to the transverse dimension D1 perpendicular to the plane of FIG. 10b, the resulting rectangular shape being shown in the view of FIG. 10d. For reference, the input face 1040b1 (see FIG. 10c) may have a square shape in plan view with the length of each side of the square being D1, the LEDs 1016a-c also having the same square shape. The reduced cross-sectional area of the rod may also contribute to reduced etendue (and increased brightness) of the lighting system.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:
1. A light source, comprising:
a flexible substrate having an aperture;
a first and second LED disposed on the substrate, the first and second LEDs adapted to emit light at different first and second peak wavelengths respectively; and
a plurality of mirrors oriented to reflect the light from the first and second LEDs into the aperture, the plurality of mirrors including at least one dichroic mirror;
wherein the flexible substrate includes a dielectric layer having a cavity region and an adjacent neighboring region that is thicker than the cavity region; and
wherein the aperture, the first LED, and the second LED are all disposed in the cavity region.

2. The source of claim 1, further comprising:
a third LED disposed on the substrate, the third LED adapted to emit light at a third peak wavelength different from the first and second peak wavelengths;
wherein the plurality of mirrors are also oriented to reflect the light from the third LED into the aperture.

3. The source of claim 2, wherein the first, second, and third LEDs emit red, green, and blue light respectively.

4. The source of claim 2, wherein the plurality of mirrors includes a first dichroic mirror adapted to reflect light at the first peak wavelength and transmit light at the second and third peak wavelengths, wherein the plurality of mirrors includes a second dichroic mirror adapted to reflect light at the second peak wavelength and transmit light at the third peak wavelength.

5. The source of claim 2, wherein the light from the first, second, and third LEDs that is reflected into the aperture combines to form a white light output of the light source.

6. The source of claim 1, further comprising:
collimation optics configured to collimate light from the first, second, and third LEDs;
wherein the plurality of mirrors are oriented to reflect the collimated light from the first, second, and third LEDs back to the collimation optics; and
wherein the plurality of mirrors in combination with the collimation optics directs light from the first, second, and third LEDs through the aperture.

7. The source of claim 1, wherein the plurality of mirrors includes a first dichroic mirror adapted to reflect light at the first peak wavelength and transmit light at the second peak wavelength.

8. The source of claim 1, wherein the dielectric layer extends from the cavity region to the neighboring region.

9. The source of claim 8, wherein the dielectric layer has a thickness of no more than 10 microns in the cavity region and a thickness of at least 20 microns in the neighboring region.

10. The source of claim 8, wherein the substrate further comprises an electrically conductive material disposed on the dielectric layer.

11. The source of claim 10, wherein the electrically conductive material is disposed on a first side of the dielectric layer, the substrate further comprising a thermally conductive layer disposed on a second side of the dielectric layer opposite the first side.

12. The source of claim 1, further comprising:
an integrating rod coupled to the aperture to receive the reflected light from the first and second LEDs.

13. The source of claim 12, wherein the integrating rod has a square or rectangular shape in cross section.

14. The source of claim 1, wherein the first and second LEDs have first and second LED widths respectively, and wherein a center-to-center distance from the aperture to the first LED is no more than 3 times the first LED width, and wherein a center-to-center distance from the aperture to the second LED is no more than 3 times the second LED width.

15. The source of claim 12, wherein the plurality of mirrors comprises a plurality of flat mirrors.

16. The source of claim 12, wherein the plurality of mirrors comprises a plurality of wedge-shaped plates, each of the wedge-shaped plates having a major surface configured to reflect light from one of the first and second LEDs into the aperture.

17. A light source, comprising:
a flexible substrate having an aperture;
a first and second LED disposed on the substrate, the first and second LEDs adapted to emit light at different first and second peak wavelengths respectively; and
a plurality of wedge-shaped plates, each having a major surface configured to reflect the light from the first and second LEDs into the aperture, the plurality of wedge-shaped plates including at least one dichroic mirror; and
collimating optics disposed between the first and second LEDs and the plurality of wedge-shaped plates to substantially collimate light from the first and second LEDs and receive reflected light from the plurality of wedge-shaped plates.

18. The light source of claim 17, wherein the flexible substrate includes a dielectric layer having a cavity region and an adjacent neighboring region that is thicker than the cavity region; and wherein the aperture, the first LED, and the second LED are all disposed in the cavity region.

19. The light source of claim 17, wherein each wedge-shaped plate of the plurality of mirrors is oriented in a different direction.

20. The light source of claim 17, wherein each component is bonded to an adjacent component to form a unitary assembly.

* * * * *